United States Patent [19]
Masheff et al.

[11] Patent Number: 4,696,017
[45] Date of Patent: Sep. 22, 1987

[54] QUADRATURE SIGNAL GENERATOR HAVING DIGITALLY-CONTROLLED PHASE AND AMPLITUDE CORRECTION

[75] Inventors: Michael S. Masheff; David E. Sanders, both of St. Petersburg, Fla.

[73] Assignee: E-Systems, Inc., Dallas, Tex.

[21] Appl. No.: 825,478

[22] Filed: Feb. 3, 1986

[51] Int. Cl.⁴ .......................................... H04L 25/49
[52] U.S. Cl. ...................................... 375/60; 375/39; 328/162; 332/23 R
[58] Field of Search ....................... 375/12, 15, 39, 99, 375/101, 102, 59, 60; 455/60, 295, 296, 305; 370/6, 21; 328/162, 166; 332/16 R, 23 R; 333/18, 28 R; 364/725, 574

[56] References Cited

U.S. PATENT DOCUMENTS

| | | | |
|---|---|---|---|
| 3,305,798 | 2/1967 | Rappeport | 333/18 |
| 3,792,378 | 2/1974 | Hughes et al. | 331/178 |
| 3,868,601 | 2/1975 | Macafee | 332/45 |
| 3,868,603 | 2/1975 | Guidoix | 333/18 |
| 3,971,996 | 7/1976 | Motley et al. | 328/155 |
| 3,974,449 | 8/1976 | Falconer | 333/28 R |
| 4,112,370 | 9/1978 | Monsen | 375/100 |
| 4,159,526 | 6/1979 | Mosley Jr. et al. | 364/721 |
| 4,220,923 | 9/1980 | Pelchat et al. | 375/101 |
| 4,255,713 | 3/1981 | Yoshida | 375/39 |
| 4,285,044 | 8/1981 | Thomas et al. | 364/721 |
| 4,306,307 | 12/1981 | Levy et al. | 375/39 |
| 4,321,705 | 3/1982 | Namiki | 375/101 |
| 4,370,749 | 1/1983 | Levy et al. | 375/99 |
| 4,468,786 | 8/1984 | Davis | 375/11 |
| 4,577,330 | 3/1986 | Kauehrad | 375/102 |

Primary Examiner—Robert L. Griffin
Assistant Examiner—Stephen Chin
Attorney, Agent, or Firm—Albert M. Crowder

[57] ABSTRACT

A digitally-controlled quadrature signal generator is provided having a frequency synthesizer for receiving a digital input signal and in response thereto generating an output signal having a predetermined frequency. The output signal is split to produce an in-phase (I) signal and a quadrature-phase (Q) signal. A first table look-up memory is provided for generating a predetermined phase correction signal for use in cancelling any phase error in the quadrature-phase signal. A mixer receives the phase correction signal and the in-phase signal and in response thereto generates a phase error signal. The phase error signal is then added to the quadrature-phase signal to thereby cancel the undesirable phase error. Moreover, programmable attenuator circuits or limiter circuits are provided to limit the in-phase and quadrature-phase signals and thereby cancel any undesirable amplitude error components therein.

11 Claims, 4 Drawing Figures

4,696,017

QUADRATURE SIGNAL GENERATOR HAVING DIGITALLY-CONTROLLED PHASE AND AMPLITUDE CORRECTION

TECHNICAL FIELD

The present invention relates to signal generation and more particularly to a quadrature local oscillator signal generator having digitally-controlled phase and amplitude correction of the generated quadrature signals.

BACKGROUND OF THE INVENTION

Quadrature local oscillator signal sources are used in the down conversion and processing of received signals in a receiver. Such devices typically include a frequency synthesizer and a 90° power splitter for generating an in-phase and a quadrature-phase signal. While such prior art devices have proven generally effective for non-precision applications, they typically produce small, but significant, amplitude and phase errors in the generated quadrature signals. The amplitude errors typically arise from non-linearities in the frequency synthesizer, while phase inaccuracies in the phase splitter produce the phase error between the in-phase and quadrature-phase signals such that these signals do not always have an exact 90° phase difference. Such errors eventually degrade the overall signal-to-noise ratio of the receiver output, thereby preventing use of the receiver in high precision applications.

Accordingly, there is a need for an improved signal generator which produces accurate quadrature signal outputs for use in high precision receiver applications.

BRIEF SUMMARY OF THE INVENTION

According to the present invention, an accurate and stable quadrature signal generator is provided comprising a frequency synthesizer for receiving an input signal and generating an output signal having a predetermined frequency. A 90° phase splitter splits the output signal to generate an in-phase (I) signal and a quadrature-phase (Q) signal at the predetermined frequency.

To compensate for undesirable amplitude and phase errors in the generated signals, a first table look-up memory is provided for receiving the input signal as an address input and in response thereto generating a digital correction word. A digital-to-analog convertor receives the digital correction word and in response thereto generates a predetermined phase correction signal. The phase correction signal is then mixed with the in-phase signal to produce a phase error signal for use in cancelling undesirable phase error between the in-phase and quadrature-phase signals. The phase error signal is then added to the quadrature-phase signal to cancel the phase error by causing the phase difference between the in-phase and quadrature-phase signals to be equal to 90°.

Amplitude errors in the generated signals are corrected by limiting the in-phase and quadrature-phase signals. Specifically, in one embodiment of the invention a second table look-up memory receives the input signal as an address input and in response thereto generates a predetermined amplitude correction word. This correction word is used to control the amount of signal attenuation provided by a pair of programmable attenuators in the in-phase and quadrature-phase signal paths. In an alternative embodiment, the amplitude error components are cancelled through use of limiter circuits interposed in the in-phase and quadrature-phase signal paths.

In yet another alternate embodiment of the invention, the phase error between the in-phase and quadrature-phase signals is cancelled through use of a phase-locked loop feedback circuit. The phase-locked loop circuit receives the in-phase signal and generates a control signal which is used as an address input to a table look-up memory. The table look-up memory stores a plurality of digital correction words for use in cancelling undesirable phase error. The digital correction word output from the table look-up memory is converted to analog form to generate the predetermined phase correction signal. As discussed above, this phase correction signal is then mixed with the in-phase signal to generate a phase error signal, which is then added to the quadrature-phase signal to cancel the undesirable phase error.

BRIEF DESCRIPTION OF THE DRAWINGS

For a more complete understanding of the present invention and the advantages thereof, reference is now made to the following Description taken in conjunction with the accompanying Drawings in which.

DETAILED DESCRIPTION

Figure 1:
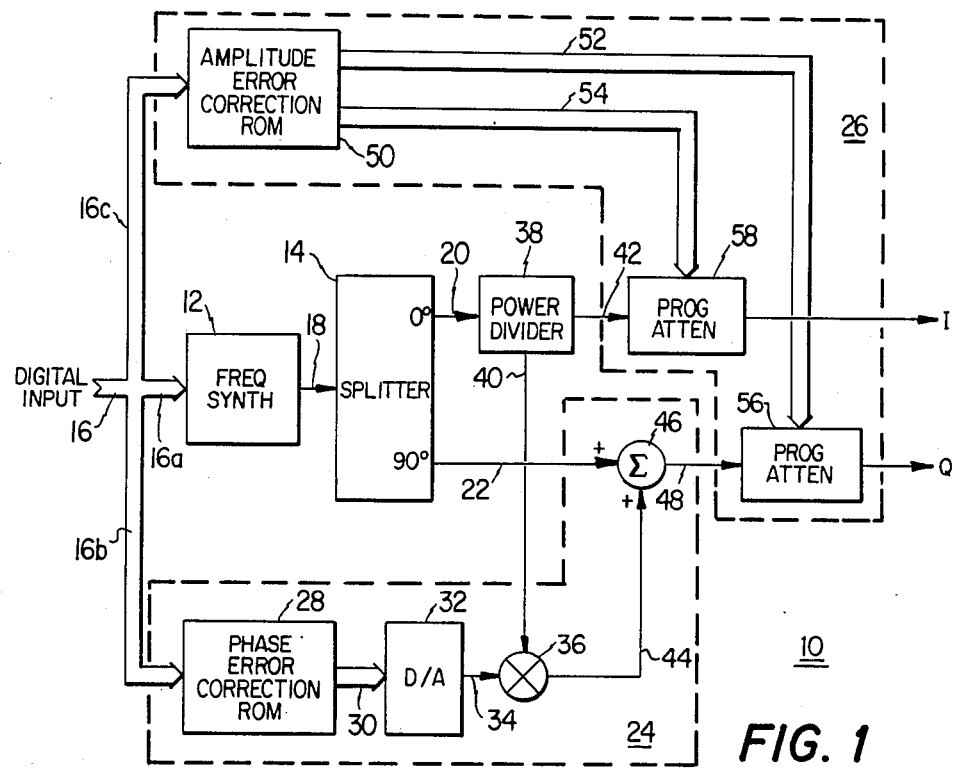
FIG. 1 is a schematic diagram of a first embodiment of the quadrature signal generator of the present invention having digitally-controlled phase and amplitude correction.

With reference now to the Drawings wherein like reference characters designate like or similar parts throughout the several figures, FIG. 1 is a detailed schematic diagram of a quadrature signal generator 10 according to the present invention. The quadrature signal generator 10 includes a frequency synthesizer 12 and a 90° phase splitter 14. An input signal representing a desired frequency is input to the frequency synthesizer 12 via a first portion 16a of a digital input bus 16. The input signal, which is preferably a digital 8-bit word, is processed by the frequence synthesizer 12 to generate a sinusoidal output signal on an output conductor 18. The output signal is then applied to the phase splitter 14. The phase splitter 14 generates an in-phase (I) signal at the predetermined frequency on conductor 20, and generates a quadrature-phase (Q) signal at the predetermined frequency on conductor 22.

The operation of the frequency synthesizer 12 and the 90° phase splitter 14 produces undesirable amplitude and phase errors in the in-phase and quadrature-phase signals. Such errors are significant, especially when the frequency synthesizer 12 is used to generate frequency signals over wide bandwidths. The amplitude errors are primarily produced by non-linearities in the frequency synthesizer 12. The phase error, i.e., a phase difference between the in-phase and quadrature-phase signals greater than or less than the required 90°, is caused by inaccuracies in the phase splitter 14.

The amplitude and phase errors in the frequency synthesizer 12 and the 90° power splitter 14 are compensated by a phase correction circuit 24 and an amplitude correction circuit 26. The phase correction circuit 24 includes a table lock-up memory 28 which stores a plurality of predetermined phase error correction words at addressable locations therein. The error correction data stored in the table look-up memory 28, which in the preferred embodiment is a read only memory (ROM), is programmed therein during a calibration routine. Specifically, the precise degree of phase error produced by the phase splitter 14 for each frequency of the frequency synthesizer 12 is first determined. A predetermined phase error correction word for the frequency is then calculated and stored at a location in the memory. The address of this location corresponds to the frequency as represented by the digital input signal.

In operation, the digital input signal applied to the frequency synthesizer 12 is also applied as an address input to the memory 28 via a second portion 16b of the input bus 16. The table look-up memory 28 receives the input signal as an address input and in response thereto generates a digital phase error correction word on an output bus 30. The digital correction word is then converted to analog form by a digital-to-analog convertor 32, which outputs a phase correction signal on the conductor 34. The phase correction signal is then applied to one input of a mixer 36.

As also seen in FIG. 1, the in-phase signal output from the power splitter 14 is supplied to a power divider 38, which generates a plurality of replicas of the in-phase signal on the conductors 40 and 42. The mixer 36 receives the phase correction signal and the in-phase signal via conductor 40, and in response thereto generates a phase error signal on an output conductor 44. The phase correction circuit 24 also includes an adder 46 having first and second inputs, the first input for receiving the quadrature-phase (Q) signal via conductor 22 and the second input for receiving the phase error signal via the conductor 44. The adder 46 adds the phase error signal to the quadrature-phase signal to cancel the phase error by causing the phase difference between the in-phase and quadrature-phase signals to be equal to 90°. The phase-corrected quadrature-phase signal is then output from the adder 46 on conductor 48.

Amplitude errors in the in-phase and quadrature-phase signals are likewise corrected through use of an addressable memory circuit. As also seen in FIG. 1, the digital input word used to address the frequency synthesizer 12 is also applied to a second table look-up memory 50, which includes a plurality of predetermined error correction words located at addresable memory locations therein. In particular, the digital input word is supplied as an address input to the memory 50, preferably a read only memory (ROM), via a third portion 16c of the input bus 16. The memory 50 generates predetermined digital amplitude correction words on the output buses 52 and 54 thereof. As discussed above with respect to the phase correction circuit 24, the amplitude correction words are pre-programmed into the memory 50 by measuring the degree of amplitude error generated by the frequency synthesizer at the various frequencies of interest.

The amplitude correction words are then applied to first and second programmable attenuators 56 and 58, respectively. In particular, the first output bus 52 of the memory 50 applies the selected amplitude correction word to the programmable attenuator 56, which cancels any amplitude error components in the quadrature-phase (Q) signal as a function of the predetermined correction word associated with the input signal frequency. Likewise, the second output bus 54 from the memory 50 controls the operation of the programmable attenuator 58 to thereby cancel any amplitude error components in the in-phase (I) signal as a function of the predetermined correction word associated with the input signal.

Accordingly, in operation of the digitally-controlled quadrature signal generator 10 of FIG. 1, phase errors are corrected by summing a portion of the in-phase (I) signal with the quadrature-phase (Q) signal. Specifically, the sign and amplitude of the (phase error) signal to be summed with the quadrature-phase (Q) signal is altered through use of the mixer 36, which is controlled by the predetermined phase correction signal derived from the memory 28 and the digital-to-analog convertor 32. The phase and amplitude error correction provided by the phase correction and amplitude correction circuits 24 and 26 provides an extremely stable and accurate quadrature signal generator for use in high precision receiver applications. Such compensation advantageously produces a reduction in the overall signal-to-noise ratio at the receiver output.

Figure 2:
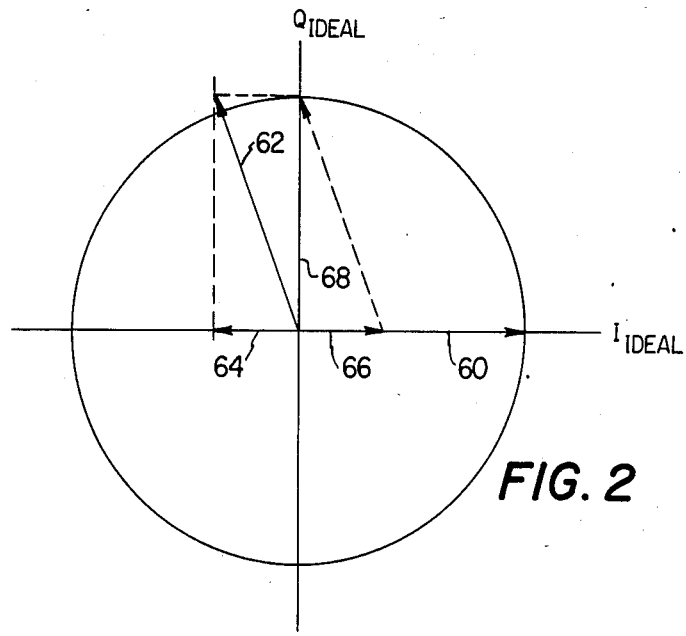
FIG. 2 is a vector representation of the digitally-controlled phase and amplitude correction provided by the circuit of FIG. 1.

Referring now to FIG. 2, a vector representation is shown to explain how the phase correction and amplitude correction circuits 24 and 26 of FIG. 1 correct undesirable phase and amplitude errors in the quadrature-phase (Q) signal. The vector representation is a phase plot with the in-phase (I) vector located on the x-axis and the quadrature-phase (Q) vector ideally located on the y-axis. Referring simultaneously to FIGS. 1 and 2, the in-phase signal output from the 90° phase splitter 14 is represented by the vector 60 lying on the x-axis of the phase plot. As also seen in FIG. 2, the quadrature-phase signal vector 62 has both undesirable phase and amplitude errors. When the quadrature-phase vector 62 is resolved along the x-axis, a quadrature-phase error vector 64 is generated. This vector corresponds to the phase correction signal output from the table look-up memory 28 as discussed above with respect to FIG. 1. As also seen in FIG. 2, an error correction vector 66 is derived from the in-phase signal. The error correction vector 66 represents the signal applied from the power divider 38 to the mixer 36 via the conductor 40. When vectors 62 and 66 are summed by the adder 46, the resultant quadrature-phase vector 68 properly lies along the y-axis to represent the compensation of the phase and amplitude errors in the quadrature-phase signal.

Figure 3:
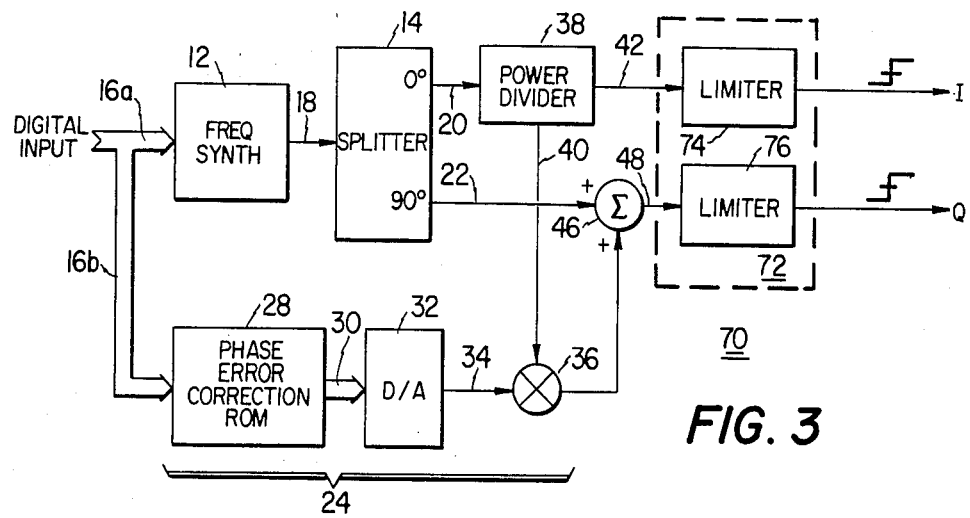
FIG. 3 is an alternate embodiment of the quadrature signal generator of FIG. 1 wherein limiter circuits are used to perform the amplitude error correction.

Referring now to FIG. 3, an alternate embodiment of the quadrature-signal generator of FIG. 1 is provided. In FIG. 3, a quadrature signal generator 70 includes the frequency synthesizer 12 and the 90° phase splitter 14, as well as the phase correction circuit 24 as discussed above with respect to FIG. 1. In this embodiment, however, an amplitude correction circuit 72 comprises first and second limiter circuits 74 and 76 interposed in the in-phase and quadrature-phase signal paths to correct undesirable amplitude errors. When the limiters 74 and 76 are used to correct for amplitude errors, the (I) and (Q) channel output signals have a squarewave envelope as opposed to a sinusoid. As can be seen, therefore, the circuit of FIG. 3 also adequately cancels the effects of undesirable amplitude and phase errors but in a simpler fashion due to the use of the limiter circuits rather than the programmable attenuators of FIG. 1.

Figure 4:
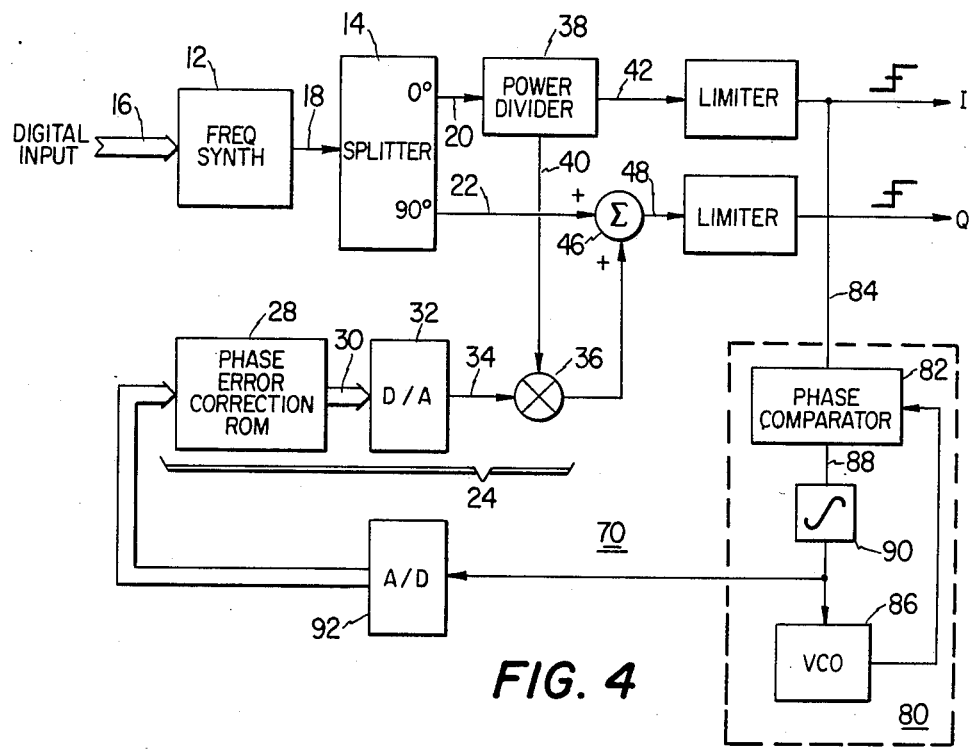
FIG. 4 is an alaternate embodiment of the quadrature signal generator of FIG. 3 wherein a phase-locked loop circuit is provided to generate a control signal as the address input to the phase correction circuitry.

FIG. 4 shows an alternate embodiment of the quadrature signal generator 70 of FIG. 3, wherein the phase correction circuit 24 is addressed via a phase-locked loop circuit 80. This method of addressing the phase correction circuit 24 is useful if the digital input signal is not available to the memory 28. In the circuit of FIG. 4, the phase-locked loop circuit 80 includes a phase comparator 82 having first and second inputs, with the first input for receiving a sample of the in-phase signal via the conductor 84. The second input of the phase comparator 82 receives an oscillator signal provided by voltage-controlled oscillator 86. The phase comparator compares the phase of the oscillator signal with the phase of the in-phase signal and in response thereto generates a comparator output signal on conductor 88. The comparator output signal is integrated by an integrator 90 to generate a control signal which is then input to control the voltage controlled oscillator 86. The control signal is also converted to digital form by an analog-to-digital convertor 92 and used as an address input to the table look-up ROM 28 as discussed above with respect to FIG. 1. Accordingly, in the operation of FIG. 4 the voltage applied to the voltage controlled oscillator 86 in the phase-locked loop 80 is monotonically related to the desired frequency of the in-phase signal. This voltage is then converted to a ditital word representing the desired frequency and is used to address the memory 28.

The technique shown in FIG. 4 allows the phase error compensation technique to be more universal because it does not require the digital input word to address the table look-up memory 28. Although not shown in detail in FIG. 4, the limiter circuits 74 and 76 therein may be replaced by the amplitude correction circuitry 26, as more particularly described in FIG. 1, without limiting any of the objects of the present invention.

Accordingly, it can be seen that the present invention describes a quadrature local oscillator signal source for use in the down conversion and processing of received signals in a receiver which produces accurate and stable in-phase and quadrature-phase signals. This operation is accomplished through use of a phase correction circuit which corrects phase errors by summing a predetermined portion (depending on the selected frequency) of the in-phase signal with the quadrature-phase signal. Appropriate amplitude error compensation is also provided by either programmable attenuators or limiter circuits. In an alternate embodiment, a phase-locked loop circuit is provided for receiving a portion of the in-phase signal and in response thereto generating a control signal for use in determining the amount of predetermined phase correction required to cancel any phase error.

Although the invention has been described and illustrated in detail, it is clearly understood that the same is by way of illustration and example only and is not to be taken by way of limitation. The spirit and scope of the present invention are to be limited only by the terms of the appended claims.

We claim:

1. A quadrature signal generator, comprising:
a frequency synthesizer for receiving an input signal and generating an output signal having a predetermined frequency, the output signal having amplitude error components;
a splitter for receiving the output signal and generating an in-phase (I) signal and a quadrature phase (Q) signal at the predetermined frequency, the in-phase and quadrature phase signals having a substantially 90° phase difference;
a table look-up memory for receiving the input signal as an address input and in response thereto generating a digital correction word;
digital-to-analog conversion means for receiving the digital correction word and in response thereto generating a predetermined phase correction signal;
means for receiving the phase correction signal and the in-phase signal and in response thereto generating a phase error correction signal;
means for adding the phase error correction signal to the quadrature phase signal to correct the phase error; and
amplitude correction means for receiving the in-phase and phase error corrected quadrature-phase signals for correction of the amplitude error components.

2. The quadrature signal generator as described in claim 1 wherein said amplitude correction means comprises:
addressable memory means for receiving the input signal as an address input and in response thereto generating a predetermined amplitude correction word; and
means responsive to said predetermined amplitude correction word for attenuating the in-phase and quadrature-phase signals to correct the amplitude error components.

3. A quadrature signal generator, comprising:
a frequency synthesizer for receiving an input signal and generating an output signal having a predetermined frequency, the output signal having amplitude error components;
a splitter for receiving the output signal and generating an in-phase (I) signal and a quadrature-phase (Q) signal at the predetermined frequency, the in-phase and quadrature-phase signals having a substantially 90° phase difference;
phase-locked loop means for receiving the in-phase signal and generating a control signal;
a table look-up memory for receiving the control signal as an address input and in response thereto generating a digital correction word;
digital-to-analog conversion means for receiving the digital correction word and in response thereto generating a predetermined phase correction signal;
means for receiving the phase correction signal and the in-phase signal and in response thereto generating a phase error correction signal;
means for adding the phase error correction signal to the quadrature-phase signal to correct the phase error; and
amplitude correction means receiving the in-phase and phase error corrected quadrature-phase signals for correction of amplitude error components.

4. The quadrature signal generator as described in claim 3 wherein said phase-locked loop means comprises:
a voltage-controlled oscillator for generating an oscillator signal;
a phase comparator for comparing the oscillator signal and the in-phase signal and in response thereto generating a comparator output signal; and means for integrating the phase comparator output signal to generate an analog version of the control signal, said control signal being applied to the voltage-controlled oscillator.

5. The quadrature signal generator as described in claim 4 wherein the phase-locked loop means further includes an analog-digital convertor for converting the analog version of the control signal to digital form.

6. A quadrature signal generator, comprising:
a frequency synthesizer for receiving an input signal and generating an output signal having a predetermined frequency, the output signal having amplitude error components;
a splitter for receiving the output signal and generating an in-phase (I) signal and a quadrature-phase (Q) signal at the predetermined frequency, the in-phase and quadrature-phase signals having a substantially 90° phase difference;
means responsive to the in-phase signal and the quadrature-phase signal and including a table look-up memory for receiving the input signal as an address input for correcting any phase error between the in-phase signal and the quadrature-phase signal;
a second table look-up memory for receiving the input signal as an address input and in response thereto generating a predetermined amplitude correction word; and
means responsive to the predetermined amplitude correction word for attenuating the in-phase and phase error corrected quadrature-phase signals for correcting the amplitude error components.

7. A digitally-controlled quadrature signal generator, comprising:
a frequency synthesizer for receiving a digital input signal and in response thereto generating an output signal having a predetermined frequency, the output signal having amplitude error components;
a splitter for receiving the output signal and in response thereto generating an in-phase (I) signal and a quadrature-phase (Q) signal at the predetermined frequency, the in-phase and quadrature-phase signals having a substantially 90° phase difference;
a first table look-up memory for receiving the digital input signal as an address input and in response thereto generating a digital correction word;
digital-to-analog conversion means for receiving the digital correction word and in response thereto generating a predetermined phase correction signal for correction of any phase error in the quadrature-phase signal;
a mixer for receiving the phase correction signal and the in-phase signal and in response thereto generating a phase error correction signal;
an adder for adding the phase error correction signal to the quadrature-phase signal to cancel said phase error by causing the phase difference between said in-phase and quadrature-phase signals to be equal to 90°; and
amplitude correction means for receiving the in-phase and phase error corrected quadrature-phase signals for the correction of amplitude error components.

8. The digitally-controlled quadrature signal generator as described in claim 7 wherein said amplitude correction means comprises:
a second table look-up memory for receiving the input signal as an address input and in response thereto generating a predetermined amplitude correction word; and
means responsive to said predetermined amplitude correction word for attenuating the in-phase and quadrature-phase signals for correction of the amplitude error components.

9. The digitally-controlled quadrature signal generator as described in claim 7 further including a power divider connected between the splitter and the mixer.

10. The digitally-controlled quadrature signal generator as described in claim 8 wherein each of said table look-up memories is a read only memory having a plurality of predetermined correction words at addressable locations stored therein.

11. A digitally-controlled quadrature signal generator, comprising:
a frequency synthesizer for receiving a digital input signal and in response thereto generating an output signal having a predetermined frequency, the output signal having amplitude error components;
a splitter for receiving the output signal and in response thereto generating an in-phase (I) signal and a quadrature-phase (Q) signal, the in-phase and quadrature-phase signals having a substantially 90° phase difference;
phase-locked loop means for receiving the in-phase signal and generating a control signal;
a table look-up memory for receiving the control signal as an address input and in response thereto generating a digital correction word;
digital-to-analog conversion means for receiving the digital correction word and in response thereto generating a predetermined phase correction signal for correction of any phase error in the quadrature-phase signal;
a power divider for receiving the in-phase signal and generating a plurality of replicas thereof;
a mixer for receiving the phase correction signal and a replica of the in-phase signal and in response thereto generating a phase error correction signal;
an adder for adding the phase error correction signal to the quadrature-phase signal to correct the phase error; and
amplitude correction means for receiving the in-phase and phase error corrected quadrature-phase signals to thereby cancel said amplitude error components.

* * * * *